United States Patent [19]

Matsumoto et al.

[11] Patent Number: 5,563,408
[45] Date of Patent: Oct. 8, 1996

[54] ABSOLUTE ENCODER HAVING ABSOLUTE PATTERN GRADUATIONS AND INCREMENTAL PATTERN GRADUATIONS WITH PHASE CONTROL

[75] Inventors: Tsuyoshi Matsumoto, Tokyo; Kou Ohno, Kanagawa, both of Japan

[73] Assignee: Nikon Corporation, Tokyo, Japan

[21] Appl. No.: 330,113

[22] Filed: Oct. 27, 1994

Related U.S. Application Data

[63] Continuation of Ser. No. 190,693, Feb. 2, 1994, which is a continuation of Ser. No. 61,279, May 13, 1993, abandoned, which is a continuation of Ser. No. 855,528, Mar. 23, 1992.

[30] Foreign Application Priority Data

Mar. 25, 1991 [JP] Japan ..................... 3-103723

[51] Int. Cl.⁶ .................................. G01D 5/34
[52] U.S. Cl. .................. 250/231.14; 250/231.16; 250/237 G
[58] Field of Search .............. 250/231.16, 231.18, 250/237 G, 231.14; 341/13, 31; 356/375

[56] References Cited

U.S. PATENT DOCUMENTS

| | | | |
|---|---|---|---|
| 4,079,251 | 3/1978 | Osann, Jr. .................. | 250/231.16 |
| 4,183,014 | 1/1980 | McClean et al. ............ | 250/231.18 |
| 4,688,019 | 8/1987 | Schmitt ...................... | 250/231.18 |
| 4,736,187 | 4/1988 | Kibrick et al. .............. | 250/237 G |
| 4,789,874 | 12/1988 | Majette et al. ............. | 250/231.1 |
| 4,914,437 | 4/1990 | Kibrick et al. .............. | 341/13 |
| 4,945,231 | 7/1990 | Ohya et al. .................. | 250/237 G |
| 5,068,529 | 11/1991 | Ohno et al. ................. | 250/231.18 |
| 5,120,954 | 6/1992 | Taniguchi ................... | 250/231.16 |

Primary Examiner—Stephone Allen
Attorney, Agent, or Firm—Michael N. Meller

[57] ABSTRACT

An absolute encoder having a coder in which an incremental pattern and an absolute pattern are arranged in parallel and a detector including sensors for detecting the incremental pattern and the absolute pattern respectively. The absolute encoder comprises a discriminater to discriminate a relative phase position of the coder and the detector in one pitch of the incremental pattern from an output of the sensor for detecting the incremental pattern, and a signal generator to generate a synchronizing signal when a discriminated phase position coincides with a predetemined phase position by means of an electric circuit in one pitch of the incremental pattern. The absolute pattern is read on the basis of the synchronizing signal at a position except for the boundary region between the minimum reading units.

5 Claims, 2 Drawing Sheets

ABSOLUTE ENCODER HAVING ABSOLUTE PATTERN GRADUATIONS AND INCREMENTAL PATTERN GRADUATIONS WITH PHASE CONTROL

This application is a continuation of application Ser. No. 08/190,693, filed Feb. 2, 1994, which application is a continuation of application Ser. No. 08/061,279, filed May 13, 1993 now abandoned, which application is a continuation of application Ser. No. 855,528, filed Mar. 23, 1992.

BACKGROUND OF THE INVENTION

1. Field of the Invention

The present invention relates generally to absolute position detection encoders and, more particularly, to an absolute encoder including a coder provided with a single track or multi-tracks of an absolute pattern graduation scale and at least one track of an incremental pattern graduation scale in parallel each other, and a detector for reading the graduations of the scales. The present invention especially provides an absolute encoder in which a strobe (synchronous) signal giving the timing to read an absolute pattern may be generated at an optional phase position in one pitch of an incremental pattern without mechanically adjusting a position of the detector or a sensor.

2. Description of the Prior Art

An absolute encoder is a measuring instrument which outputs position information of a detector in relation to a graduation on a coder with an absolute position signal inherently adapted to the relative position. The coder and the detector are assembled to allow them to move relative to one another. The coder is provided with an absolute pattern graduation scale having a numerical code of an absolute position signal which is replaced with physical information and arranged in the longitudinal direction of a track. And the detector has a plurality of sensors for discriminating the physical information of the pattern. The absolute encoders are classified into two types according to their appearance, the one is a linear type in which the detector moves relatively and linearly along the longitudinal direction of the strip type coder, and the other is a rotary type in which the detector moves relatively and angularly around a disk or a cylindrical coder. Whichever the type of the absolute encoder may be, it is a measuring instrument which directly reads a graduation information (absolute position signal) registered as physical information on an absolute pattern graduation scale by the sensors of the detector and rearranges into the numerical code by means of an electrical signal processing.

In the past, the common type of the absolute encoders is known as the multi-track type. In this type, an absolute pattern is formed by a plurality of parallel tracks each having an incremental pattern of different pitches, which is called as a multi-track type absolute pattern graduation scale. A detector for reading the multi-track type absolute pattern graduation scale includes a plurality of sensors arranged in the respective positions basically corresponding to that of each track one by one, and an absolute position signal of "binary number of good order" having binary code or gray code is assembled from the outputs of the sensors.

For example, in a four-track type absolute encoder which reads a four-digit binary code, four parallel incremental pattern tracks consisting of mark space patterns of different pitches are formed on the coder, that is:

| | |
|---|---|
| $2^3$-track ... ... | 0000000011111111 |
| $2^2$-track ... ... | 0000111100001111 |
| $2^1$-track ... ... | 0011001100110011 |
| $2^0$-track ... ... | 0101010101010101 |
| Absolute position ... ... | defghijklmnop |

On the detector, there is arranged four sensors along the direction crossing to the tracks on coder, and their positions at the same phase position of the four tracks are read out in parallel manner so as to obtain sixteen absolute position signals of binary numbers a to p in good order from a=0000, b=0001 to o=1110, p=1111, successively.

Meanwhile, recently a number of absolute encoders using a single-track type absolute pattern have been actively developed and practiced in place of multi-track types. In this type of the encoders, an absolute pattern is constructed with a single track of a mark-space pattern of irregular pitch which is called single-track type absolute pattern graduation scale. In the single-track absolute pattern graduation, "1" and "0" of a special sequence of binary numbers such as Full Periodic Sequence or M-Sequence are replaced by two kinds of minimum reading units having different physical characteristics, and arranged on the track in single line. On the detector, a plurality of sensors are arranged in single line with a pitch fundamentally of the minimum reading unit length along the single-track type absolute pattern graduation scale, and an absolute position signal consisting of "different binary numbers having random order" is assembled from the outputs of said plurality of sensors.

In the absolute encoder using a single-track type absolute pattern, it is extremely advantageous to miniaturize the size of the encoder and to simplify the whole construction of the encoder including their wirings because of the reasons (a) only one absolute pattern is needed, (b) a number of sensors are arranged in single line with a constant distance between them, so that a sensor array is usable in which a number of sensors are collectively formed on one substrate and (c) phase adjustment of sensor position as in case of multi-track type is not needed between each of the tracks.

For example, when using a sequence of numbers 000100110101111 of M-Sequence comprising fifteen binary codes per one period, "0" and "1" of said sequence of numbers are replaced by two kinds of the minimum reading units having different physical characteristics, so as to form a single-track type absolute pattern on the coder, that is:

| |
|---|
| 000100110101111 |
| abcdefghijklmno |

It should be noted that this pattern only indicates one of the minimum unit of repetition, and thus "a" is repeated again after the last "o". In this pattern four succeeding digits are read as a code, and the phase information of each code is represented by the alphabetic character shown below the left end of the four digits. Meanwhile, on the detector are arranged four sensors corresponding to the four succeeding minimum reading units. The sensors generates fifteen absolute position signals comprising binary numbers of random order having a different content of codes each other from a=0001, b=0010 to n=1100, o=1000 one by one. Here, when a practical problem occurs because of the random order of the absolute position signal, the absolute position signal is not allowed to be outputted as it is, but to be converted corresponding to "an address of correct order" such as binary code one to one by using a semiconductor memory in which a proper conversion table is stored, so as to output an absolute position signal of correct order.

Incidentally a single-track type absolute encoder frequently has a malfunction (a misreading of a pattern) when a sensor sweeps the boundary region of the minimum reading unit and therefore, in general, the time to read a single-track type absolute pattern by the sensor is adjusted to read the pattern at a position except for the boundary region.

That is, on the one hand, in the boundary region of the minimum reading unit where the output is inverted, the sensor output becomes unstable, and other hand, there is an inconformity between respective pitchs of the pattern and that of the sensors, and further, the sensor characteristics are not constant, then, there is occasionally a time lag between output change timings in a plurality of sensors. At this time, at least one digit of a binary number which constructs an absolute position signal is outputted as an inverted signal, so that an abnormal absolute position signal which is apart from a correct absolute position may be outputted.

In general, as to the method for adjusting the time to read a pattern, another parallel incremental pattern graduation scale may be used additionally. In this case, the incremental pattern graduation scale is provided on the coder in parallel with a single-track type absolute pattern graduation scale, further, another sensor is added on the detector to detect the incremental pattern, and thus a strobe (synchronous) signal is generated to give the timing to detect the single-track type absolute pattern from the output of the additional sensor.

That is, the position of said additional sensor is mechanically adjusted to the incremental pattern in such a manner that, in the position relationship between the coder and the detector within one pitch of the incremental pattern, if the sensors for detecting the single-track type absolute pattern are on the position where the boundary region of the minimum reading unit is to be detected for example, a strobe signal "0" is outputted from said additional sensor, and if the absolute pattern sensors are on the position to detect a region except for said boundary region, a strobe signal "1" is outputted from the additional sensor, thus the reading of single-track type absolute pattern is performed by the sensors for detecting said absolute pattern only when the strobe signal is "1".

Meanwhile, U.S. Pat. No. 5,068,529 for example, discloses an absolute encoder wherein a set of sensors in the position corresponding to the center of the minimum reading unit is always selected by means of alternatively switching over two pairs of sensor groups one to another in accordance with a strobe pulse obtained from the detection of an incremental pattern in order to secure the timing to read the absolute pattern. In this case, in front of a single-track type absolute pattern of a minimum reading unit length $\lambda$, said two pairs of sensor groups which comprises a plurality of sensors arranged with a pitch $\lambda$ are arranged in the detector with a positional phase difference of $\lambda/2$ between each of the pairs, and thus one of the two pairs of sensor groups is selected depending on "0" or "1" of the incremental pattern of pitch $\lambda$. In this way, absolute position signals are successively obtained without any separations on the single-track type absolute pattern, and in any relative position between the coder and the detector, the boundary region is not allowed to be detected.

Incidentally, a similar malfunction may occurr in the multi-track type absolute encoder, the similar measure is used for solving the problem. That is, in a phase position where two or more incremental patterns of different mark-space pitch which construct a multi-track type absolute pattern are inverted simultaneously, if the sensor outputs corresponding to respective patterns are not inverted simultaneously, an abnormal absolute position signal apart from the correct absolute position is also occasionally outputted.

Therefore, in the similar way as above, each pattern except for the last digit is detected by two sensors arranged with a distance corresponding to one half of the minimum pitch (the last digit) of the pattern, and thus, depending on the strobe signal "0" or "1" which is obtained by the detection of the incremental pattern of the last digit, one of the two sensors is to be selected. In this manner, each of the inversion of the respective sensor outputs for all of the patterns will be concurred with each other, so as to make the absolute position signal output stable.

In the above described measures, in which the time period for reading other absolute patterns arranged on the coder is limited by using a strobe signal obtained from the detection of an incremental pattern, and the inversion timings of the sensor outputs corresponding to the absolute pattern are made uniform, the sensor for detecting the incremental pattern should be positioned accurately on the detector. That is, since both the absolute pattern and the incremental pattern are fixedly arranged on the coder so that the mutual phase adjustment is impossible, it is neccessary on the detector side to adjust the positional relation between the sensor for detecting the incremental pattern and the sensors for detecting the absolute pattern within one pitch of the incremental pattern to the accuracy needed for performing each of the above described operation.

For example, in a single-track type absolute encoder where a sensor array for detecting an absolute pattern and an additional sensor for detecting an incremental pattern are preliminarily fixed on the detector, the coder is actually moved relative to the detector, and the mechanical position of the additional sensor is manually adjusted by means of a screw mechanism mounted on the additional sensor while comparing an output from the sensor array with an output from the additional sensor by means of an oscilloscope.

Therefore, it is required for the absolute encoder to hold an additional space for adjusting mechanism of the sensor position and for the adjusting works thereof, thereby the absolute encoder is prevented from miniatuarizing, reducing the number of parts and automization of the assembling process. In addition, the adjusting mechanism is harmful for the solidity of the absolute encoder, and the adjusting works requiring many workers and spending much time make the process rationalization difficult and affect the accuracy and reliability of the absolute encoder. With the recent tendency of high resolution of the coder and reduction of the minimum reading unit length, a higher accuracy is required to the adjusting works, but the accuracy already cannot be attained with the conventional mechanical system.

SUMMARY OF THE INVENTION

Therefore, the main object of the present invention is to provide an absolute encoder in which a position of a sensor need not be adjusted in a mechanical manner but it can be adjusted electrically.

According to one aspect of the present invention, the object is attained with an absolute encoder including coder means on which an absolute pattern and an incremental pattern are arranged in parallel and detector means having a plurality of sensor means for detecting each of the patterns, said coder means and said detector means being adapted to move relative to one another, wherein said absolute encoder comprises discriminating means for discriminating a relative phase position of the coder means and the detector means within a period of the incremental pattern on the basis of a detecting signal of the incremental pattern; and signal generating means for generating a synchronizing signal to read out said absolute pattern when the phase position discriminated by said discriminating means becomes a predetermined phase position.

According to a preferred embodiment of the present invention, said absolute encoder comprises a single-track type absolute pattern, two groups of sensors for detecting said single-track absolute pattern, and selecting means for alternatively selecting one of outputs from each of said groups on the basis of said synchronizing signal.

In the absolute encoder according to an embodiment of the present invention, the mechanical adjustment for the position of the sensor or sensors is not neccessary, but the time period for generating said synchronizing signal is adjusted in relation to the phase position within one pitch of the incremental pattern by setting or adjusting on an electric circuit. That is, according to the present invention, an output of the sensor for detecting an incremental pattern is not produced as a synchronizing signal having the phase condition as it is, but a fresh synchronizing signal is generated, which is discriminated on the basis of the output of the sensor for detecting the incremental pattern and is to be inverted at a predetermined phase position within one pitch of the incremental pattern. Here, the predetermined phase position may optionally be changed by means of certain variable adjusting electronic parts such as a variable resistance or change-over switch, even after the absolute encoder is assembled.

The sensor for detecting the incremental pattern and the sensor group for detecting the absolute pattern are preliminarily fixed on the detector, fundamentally. Said discriminating means discriminates a detecting position in each pitch of the incremental pattern, that is, a location to be detected in the phase position obtained by dividing said each pitch with a proper width, investigating the output phase of the sensor for detecting the incremental pattern. As a concrete discriminating method for example, two quasi-sine waves out of phase by 90 degrees (phase A signal and phase B signal) are generated from detection of the incremental pattern by two sensors arranged with a distance of a fourth of a pitch, so as to compare their phases each other. In addition to this, a number of methods may be applied, such as dividing resistance method, or method for generating a tangent signal from the above two sine-wave signals. Here, when generating the tangent signal, two quasi-sine waves are considered as a sine wave and a cosine wave, and their ratio is calculated by means of an analog circuit.

In the signal generating means, at least two specific phase position can be set optionally within said one pitch. The signal generating means generates, as a synchronizing signal, a rectangular wave or a trigger pulse which is inverted when a phase position discriminated by the discriminating means coincides with the set position of the phase. The synchronizing signal can be used as a strobe signal to determine the timing for detecting the absolute pattern. When a distance between two set positions of the phase is adjusted, the duty ratio of said rectangular wave may also be set optionally and conveniently.

The present invention may be applied to the above described single-track absolute encoder in which a single-track absolute pattern is read out successively while switching two groups of sensors alternatively.

That is, selecting means alternatively selects one of the outputs of said two sensor groups which are arranged for detecting the single-track absolute pattern on the basis of "0" or "1" state of a rectangular wave output produced as a synchronizing signal from the signal generating means. In this way, an absolute position signal is generated successively without and separation on the single-track absolute pattern, and the absolute pattern is read out with higher stability on a position except for the boundary area between the minimum reading units.

In the absolute encoder according to the present invention, mechanical position adjustment of the sensor in relation to the coder is not needed fundamentally. And, even after assembling the absolute encoder, the phase position of the synchronizing signal can easily be adjusted.

The above and the other features and advantages of the present invention will be understood more clearly from the following description of the preferred embodiments referring to the accompanying drawings which are shown merely as an example.

DESCRIPTION OF THE PREFERRED EMBODIMENTS

Figure 1:
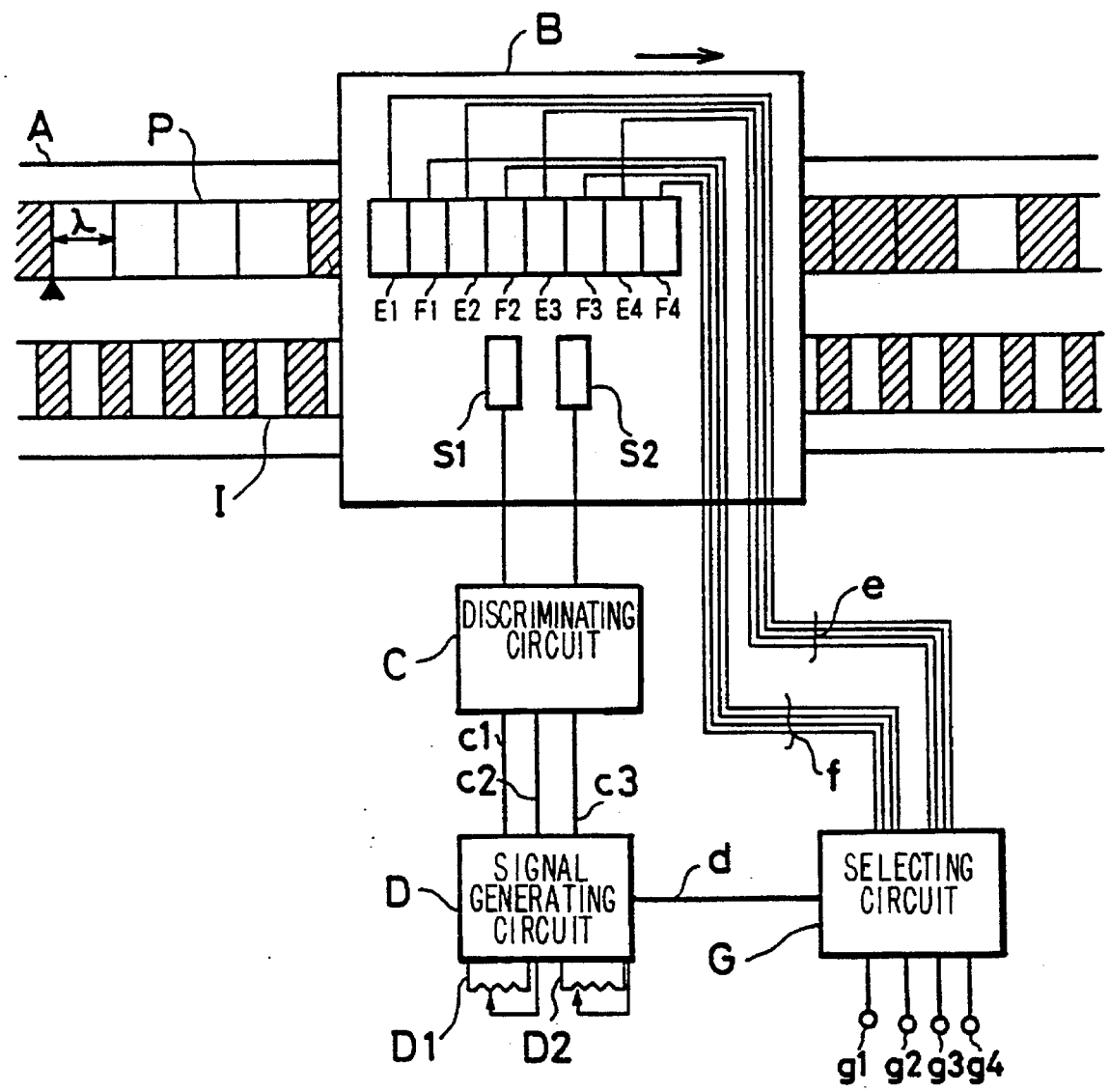
FIG. 1 shows schematically the fundamental construction of an absolute encoder according to the one embodiment of the present invention.

FIG. 1 shows schematically the construction of an absolute encoder according to an embodiment of the present invention. In this embodiment, a single-track absolute pattern on a coder is detected by means of two groups of sensors, and an incremental pattern which is arranged on the coder in parallel with the absolute pattern track is detected by means of two other sensors. By discriminating phases of outputs generated from the above two sensors by means of an electric circuit, a synchronizing signal of rectangular wave is newly generated. The synchronizing signal is inverted at the optimum phase position within one pitch of the incremental pattern. Depending on "0" or "1" of the synchronizing signal, one of said two groups of sensors is selected, and thus the absolute pattern is read out at a position except for a boundary area of the minimum reading units.

In FIG. 1, the coder A has a single-track absolute pattern P in which, considering a triangle mark in the figure as a starting point, "0" and "1" of a sequence of numbers 0000101100111101 are formed by two kinds of the minimum reading unit (white portion and shaded portion) having a length$\lambda$, and an incremental pattern I having arrayed alternately divisions (reading units) whose repeated period (pitch) is equal to the length$\lambda$ in this case and arranged in parallel with the pattern A. A detector B has a first group of sensors comprising four sensors E1 to E4 which are arranged with a pitch $\lambda$, and a second group of sensors comprising four sensors F1 to F4 which are arranged with a pitch λ and are out of phase with a phase difference corresponding to λ/2 from the first sensor group. In this case, the above described first and second sensor groups are facing to the absolute pattern P. Moreover, on the detector B are arranged two sensors S1 and S2 having a phase difference of λ/4 with each other facing to the incremental pattern I.

A discriminating circuit C receives outputs of approximately triangle waveform from the sensors S1 and S2 as a sine wave (phase A signal) and a cosign wave (phase B signal) and compares the phase A signal with the phase B signal, and then discriminates in real time which one of eight phase positions (0 to 7, in FIG. 2) in each pitch λ corresponds to phase relation between the present coder and the detector so as to generate each corresponding phase position information as output signals c1 to c3 in binary code. A signal generating circuit D has variable resistances D1 and D2 for setting two specific phase positions respectively among the eight phase positions in the pitch λ and inverts a synchronizing signal d generated on its output terminal when a phase position of the outputs c1 to c3 of the discriminating circuit C coincides with two specific phase positions set by the variable resistances D1 and D2. A selecting circuit G selects either a group of outputs e1 to e4 generated from the first group of sensors E1 to E4 or a group of outputs f1 to f4 generated from the second group of sensors F1 to F4 to connect thus selected outputs to its output terminals g1 to g4.

In the absolute encoder having the above described construction, if the detector B moves to an arrowed direction relative to the coder A, the outputs e1 to e4 of the first sensor group or the outputs f1 to f4 of the second sensor group are generated alternately from the output terminals g1 to g4 of the selecting circuit G whenever a rectangular wave (synchronizing signal d) of period λ newly formed in the signal generating circuit D is inverted.

Therefore, after the variable resistances D1 and D2 of the signal generating circuit D are adjusted while moving the detector B relative to the coder A within a range of one pitch λ in such a manner that, on the output terminals g1 to g4 of the selecting circuit G, the outputs f1 to f4 of the second sensor group are to be generated at the phase position where the first group of sensors (E1 to E4) will detect the boundary area of the minimum reading unit, or the outputs e1 to e4 of the first sensor group are to be generated at the phase position where the second group of sensors (F1 to F4) will detect the boundary area of the minimum reading unit.

Figure 2:
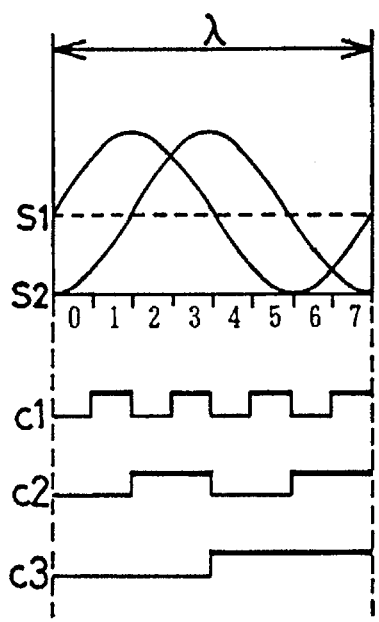
FIG. 2 is a timing chart of input and output waveform of the discriminating circuit for one pitch, according to the embodiment shown in FIG. 1.

FIG. 2 is a timing chart illustrating waveforms of input and output signals of the discriminating circuit C according to the above described embodiment. In this figure, the output s1 of the sensor S1 changes like a sine wave, and an output s2 of the sensor S2 changes like a minus cosine wave, accompanied by the relative movement in one pitch λ of the coder A and the detector B. The discriminating circuit C performs the comparison of the phases A and B for the outputs s1 and s2, and discriminates position relation between the coder A and the detector B in one pitch λ with an interval of λ/8. Each phase position is indicated as a three-digit binary code from 000 to 111, each digit corresponding to the output c1, c2 and c3.

Figure 3:
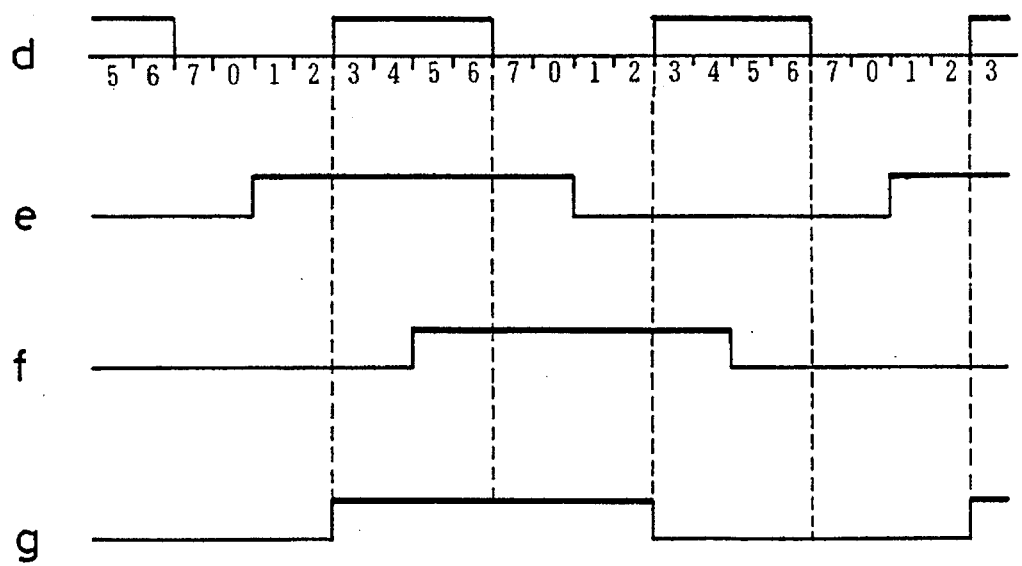
FIG. 3 is a timing chart of input and output signals of the selecting circuit, according to the embodiment shown in FIG. 1.

FIG. 3 shows waveforms of input and output signals of the selecting circuit G according to the embodiment. In this figure, a boundary area between address 2 namely "010" in binary code "c3, c2, c1" using the outputs c1 to c3 generated from the discriminating circuit C and address 3 indicated as "011" and a boundary area between address 6 indicated as "110" and address 7 indicated as "111" are considered as the above mentioned "specific phase positions" set by the variable resistances D1 and D2 of the signal generating circuit D. Also it is assumed that a rectangular wave (synchronizing signal d) is so formed as to be inverted in each of the above boundary areas and applied to a control input of the selecting circuit G.

In FIG. 3, when the synchronizing signal d applied to the selecting circuit G is "0", the outputs f1 to f4 of the second group of sensors F1 to F4 are selected, and when the synchronizing signal d is "1", the outputs e1 to e4 of the first group of sensors E1 to E4 are selected, so as to be generated from the outputs g1 to g4 of the selecting circuit G. Therefore, the outputs g1 to g4 of the selecting circuit G will have values selected to synchronize with the rise and fall edges of the input synchronizing signal d, as a result, the portion corresponding to the rise and fall edges of the outputs e1 to e4 and f1 to f4 of the sensors E1 to E4 and F1 to F4, are removed from the outputs g1 to g4 of the selecting circuit G. For the convenience of explanation, sensor outputs e and f and a selected output g are indicated without any suffix in FIG. 3.

Although the absolute encoder in which one of two groups of sensors is selected alternately to read a single-track absolute pattern except for its boundary area of the minimum reading units has been explained in the above embodiment, the present invention may also be applied to other types of absolute encoders such as, for example, an encoder having a multi-track type absolute pattern scale as is already described in the description of prior art.

What is claimed is:

1. An absolute encoder comprising:

a coder having a first pattern and a second pattern;

a detector including a first sensor for reading said first pattern to produce a first detection signal and a second sensor for reading said second pattern to produce a second detection signal, said coder and said detector being assembled to allow to move relative to one another; and an electric circuit for electrically adjusting the phase position relation between said first detection signal and said second detection signal, wherein said electric circuit includes a variable resistor for adjusting the phase of said second detection signal in relation to the phase of said first detection signal by means of the variation of the resistance of said variable resistor.

2. An absolute encoder comprising:

a coder having an absolute pattern and an incremental pattern;

a detector including an absolute sensor for reading said absolute pattern to produce an absolute signal and an incremental sensor for reading said incremental pattern to produce an incremental signal, said coder and said detector being assembled to allow to move relative to one another;

a discriminating circuit for generating a plurality of discriminated phase position informations within one period of said incremental signal; and a signal generating circuit for generating a synchronizing signal for extracting said absolute signal at a predetermined phase position selected from said discriminated phase position informations.

3. An absolute encoder according to claim 2, wherein said absolute pattern is composed of a plurality of minimum reading units each having a length lambda and arranged in a predetermined direction, said incremental pattern being arranged with a constant pitch equal to said length lambda in parallel to said absolute pattern, wherein said absolute sensor includes a plurality of first detecting elements arranged apart from each other with a pitch equal to said length lambda and a plurality of second detecting elements arranged apart from each other and being out of phase with a phase difference of lambda/2 from each of the said first detecting elements, wherein said incremental sensor comprises a third detecting element and a fourth detecting element which are arranged apart from each other with a distance of lambda/4, each of said first, second, third and fourth detecting elements having an uniform width of lambda/2, said first detecting elements being adapted for reading said absolute pattern to produce a first absolute signal, said second detecting elements being adapted for reading said absolute pattern to produce a second absolute signal having a phase difference of lambda/2 from said first absolute signal, said third detecting element being adapted for reading said incremental pattern to produce a first incremental signal, said fourth detecting element being adapted for reading said incremental pattern to produce a second incremental signal having a phase difference of lambda/4 from said first incremental signal, wherein said discriminating circuit discriminates phase position relation between said first and second incremental signals in a period corresponding to said pitch lambda of said incremental pattern to produce said discriminated phase position informations corresponding to a plurality of discriminated phase positions in said period, and wherein said signal generating circuit generates said synchronizing signal for alternately extracting said first and second absolute signals on the basis of said discriminated phase position informations.

4. An absolute encoder according to claim 3, further comprising an electric circuit for setting a phase position corresponding to one of said discriminated phase position informations and a selecting circuit for alternately selecting said first and second absolute signals on the basis of said synchronizing signal, and wherein said signal generating circuit generates said synchronizing signal when one of said discriminated phase position informations coincides with one of said phase positions set by said electric circuit.

5. An absolute encoder according to claim 3, said synchronizing signal corresponds to one of said first and second incremental signals having a phase adjusted in relation to the phase of said first and second absolute signals.

* * * * *